United States Patent [19]

Seo et al.

[11] Patent Number: 5,757,069

[45] Date of Patent: May 26, 1998

[54] SEMICONDUCTOR LEAD FRAME AND PACKAGING METHOD

[75] Inventors: Man-cheol Seo; Han-gyu Kim, both of Yongin, Rep. of Korea

[73] Assignee: Samsung Aerospace Industries, Ltd., Kyongsangnam-do, Rep. of Korea

[21] Appl. No.: 805,657

[22] Filed: Feb. 27, 1997

[30] Foreign Application Priority Data

Feb. 28, 1996 [KR] Rep. of Korea .................. 96 5086

[51] Int. Cl.$^6$ ............................................. H01L 23/495
[52] U.S. Cl. ............................................. 257/673; 257/666
[58] Field of Search ................................... 257/673, 666, 257/735; 438/111, 123

[56] References Cited

U.S. PATENT DOCUMENTS 4,701,363  10/1987  Balber ..................... 257/673
5,359,223  10/1994  Nakamori ................. 257/673
5,521,426  5/1996   Russell .................... 257/673
5,635,755  6/1997   Kinjhorn .................. 257/666
5,648,682  7/1997   Nakazawa ................ 257/673

*Primary Examiner*—Mahshid D. Saadat
*Assistant Examiner*—S. V. Clark
*Attorney, Agent, or Firm*—Finnegan, Henderson, Farabow, Garrett & Dunner, L.L.P.

[57] ABSTRACT

A semiconductor lead frame in which a semiconductor chip is mounted using an insulating adhesive film. The semiconductor lead frame includes an inner lead and a plating layer. The inner lead has a plating groove formed therein at an end portion of a surface opposite a surface to which the insulating adhesive film is attached. The plating layer rests on the plating groove such that an upper surface of the plating layer and the opposite surface of the inner lead are flush. Since the upper surfaces of the plating layer and the inner lead are flush, a pressing force by a heater is uniformly transmitted to a semiconductor chip, thereby improving adhesion reliability of the semiconductor chip.

7 Claims, 1 Drawing Sheet

SEMICONDUCTOR LEAD FRAME AND PACKAGING METHOD

BACKGROUND OF THE INVENTION

The present invention relates to a semiconductor lead frame, and more particularly, to a semiconductor lead frame in which a plating groove is formed on an inner lead to improve adhesivity between an insulating adhesive film and a semiconductor chip in an assembly process of an LOC (lead on chip) or COL (chip on lead)-type semiconductor lead frame, and to a semiconductor packaging method using the plating groove.

A semiconductor lead frame which forms a semiconductor package together with a wafer, includes a pad on which a semiconductor chip is mounted and a lead which enables connection between the inside and the outside of the semiconductor device. There are many types of adhesives currently used to attach a chip to the lead frame in an assembly process of a semiconductor chip, including an Ag-epoxy adhesion method, a solder adhesion method, and an Au/Si eutectic adhesion method. After the chip adheres to a pad of the lead frame, the inner leads are wire-bonded.

During conventional chip adhesion processes, pores and bubbles are generated between the chip and the pad, causing the chips to crack and/or causing a separation of a layer in the semiconductor package. To combat this problem, a through hole is formed at the center of the pad to reduce the adhesion area between the chip and the pad. However, there is a limit to the degree to which the adhesion area can be reduced due to the fluidity and the characteristics of the adhesive.

Recently, a tape adhesion method has been used to overcome these disadvantages. The tape adhesion method includes two types: a pad modification type in which the pad of the lead frame is modified and a COL or LOC-type in which the pad is removed.

The pad modification type prevents chip cracking, layer separation, and chip popping due to a difference in the thermal expansion coefficients between the chip and the pad. In the pad modification type, at least two support bars, or tie bars, are connected to support the pad. A rectangular or circular through hole is formed inside the pad, and a tape is attached along the edge of the through hole. The tape adhesion method facilitates the design of the through hole compared to the conventional Ag-epoxy adhesion method, and improves adhesion reliability by providing a uniform thickness of a tape adhesion area.

FIG. 1 illustrates a lead frame of the conventional LOC-type. Inner leads 2 and 2' of the lead frame and semiconductor chip 10 adhere to each other by insulating adhesive films 3 and 3'.

The LOC-type lead frame is manufactured in the following manner. First, plating layers 4 and 4' of a predetermined length are respectively formed on an upper surface of one end of inner leads 2 and 2'. Plating layers 4 and 4', which are usually plated with silver, facilitate the conductivity of the wire bonding.

Insulating adhesive films 3 and 3' are then attached to the opposing surface of inner leads 2 and 2'. Semiconductor chip 10 attaches to insulating adhesive films 3 and 3'. Heaters 1 and 1' apply thermal pressure to adhere semiconductor chip 10 to inner leads 2 and 2' via insulating adhesive films 3 and 3'.

However, when heaters 1 and 1' apply pressure to adhere semiconductor chip 10 to inner leads 2 and 2' after plating layers 4 and 4' are attached, heaters 1 and 1' cannot exert uniformly distributed pressure. This distribution problem is due to the difference in height between plating portion 4 and non-plating portion 4a. As a result, heaters 1 and 1' do not provide the necessary uniform pressing force to adhere semiconductor chip 10 to insulating adhesion films 3 and 3'.

Furthermore, if a protrusion 4b is formed on plating layer 4' during the plating process, the distribution of the pressing force becomes even more irregular. This irregularity results in a non-adhesion portion being generated between the lead frame and the semiconductor device, causing cracks in the semiconductor package. In order to prevent the generation of this non-adhesion portion when manufacturing lead frames of the LOC-type, excessive pressure or high temperature is must be applied to a portion where the insulating adhesive film is attached.

SUMMARY OF THE INVENTION

To solve the above problems, it is an object of the present invention to provide a lead frame having a plating groove on the upper surface of an end portion thereof. A plating layer is set in the plating groove to eliminate the height difference and to thereby uniformly distribute the pressing force during adhesion of an insulating film. It is another object of the present invention to provide a semiconductor packaging method by which a semiconductor is assembled using the present inventive plating groove.

To achieve the first object, the present invention provides a semiconductor lead frame in which a semiconductor chip is mounted using an insulating adhesive film. The semiconductor lead frame includes an inner lead and a plating layer. The inner lead has a plating groove of a predetermined depth at an end portion of a surface opposing a surface where the insulating adhesive film is attached. The plating layer rests on the plating groove such that an upper surface of the plating layer and the opposing surface of the inner lead are at the same height.

The plating layer preferably has a thickness within 70% of the thickness of the inner lead. The length of the plating groove is preferably at least as long as the length of the portion where the insulating adhesive film is to be attached, and is preferably formed by a pressing or half etching process.

To achieve the second object, there is provided a semiconductor packaging method. The method forms a plating groove at an end portion of a surface of an inner lead opposite a surface to which an insulting adhesive film is attached, forms a plating layer on the plating groove such that the upper surface of the plating layer and the opposite surface of the inner lead are flush, and attaching the insulating adhesive film to a surface opposing the plating layer surface of the inner lead by pressing a semiconductor chip.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The following detailed description of the invention refers to the accompanying drawings that illustrate preferred embodiments consistent with the principles of this invention. Other embodiments are possible and changes may be made to the embodiments without departing from the spirit and scope of the invention. The following detailed description does not limit the invention. Instead, the scope of the invention is defined only by the appended claims.

Figure 1:
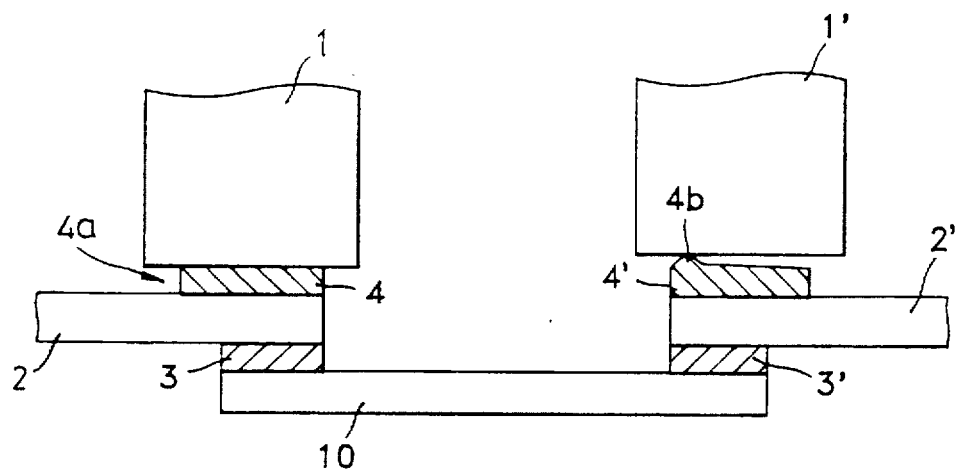
FIG. 1 is a diagram illustrating a state in which a semiconductor lead frame adheres to a semiconductor chip according to conventional technology.
Figure 2:
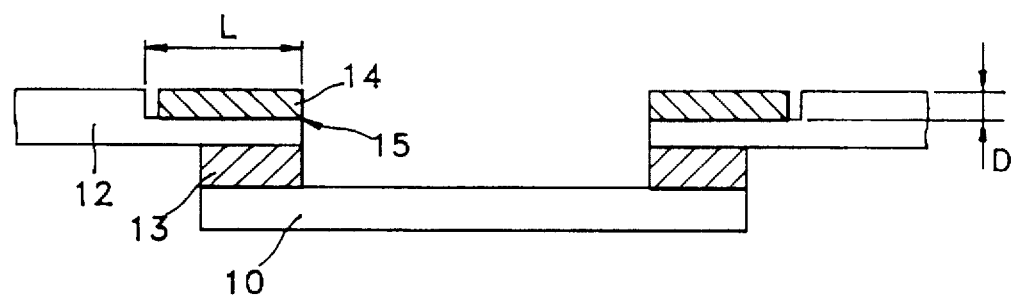
FIG. 2 is a diagram illustrating a state in which a semiconductor lead frame adheres to a semiconductor chip according to the present invention.

FIG. 2 shows an LOC or COL-type semiconductor lead frame, according to the present invention, having inner lead 12 with semiconductor chip 10 adhered thereto by insulating adhesive film 13. Plating groove 15 holds plating layer 14 and is formed in one surface of inner lead 12. Plating groove 15 is preferably formed by a pressing process or a half etching process. To permit a uniform distribution of a pressing force by a heater (not shown), the length L of plating groove 15 is preferably longer than a portion to which insulating adhesive film 13 is attached.

After the plating groove 15 is formed, plating layer 14 is set on plating groove 15. Plating layer 14 is preferably plated with gold or silver. The thickness D of plating layer 14 is preferably within 70% of the thickness of inner lead 12. If plating layer 14 is made excessively thick, however, the strength of inner lead 12 may become too weak.

Plating layer 14 is designed such that the upper surface of plating layer 14 is flush with the surface of the inner lead 12, and may be formed to completely fill plating groove 15. But preferably, the length of plating layer 14 is designed to most uniformly transmit the pressing force of a heater (not shown).

After plating layer 14 is formed, insulating adhesive film 13 is attached to the side of inner lead 12 opposite plating layer 14. A heater then presses semiconductor chip 10 to adhere it to inner lead 12 through insulating adhesive film 13. Because the upper surfaces of plating layer 14 and inner lead 12 are flush according to the present invention, the pressing force applied by the heater to inner lead 12 and semiconductor chip 10 becomes uniform regardless of its position.

Once the semiconductor chip 10 has been attached, wire bonding between plating layer 14 on inner lead 12 and semiconductor chip 10 is made, and the subsequent packaging processes are performed.

As described above, according to the semiconductor lead frame and the semiconductor packaging method of the present invention, in a semiconductor chip assembly process using the tape adhesion method, the pressing force is uniformly transmitted from the heater to the lead frame and the semiconductor chip, resulting in no non-adhesion portions being generated and a reduction in the amount of inferior products produced. Also, cracking and damage to the products occurring during subsequent packaging processes can be prevented, thereby improving reliability of the semiconductor package.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. The scope of the invention is defined by the claims and their equivalents.

What is claimed is:

1. A semiconductor lead frame for receiving a semiconductor chip mounted through an insulating adhesive film, the semiconductor lead frame comprising:

an inner lead comprising first and second opposing surfaces, the second surface receiving an adhesive film and the first surface having a plating groove formed to a predetermined depth at an end portion of the first surface opposite the portion of the second surface to which the insulating adhesive film is received; and a plating layer set on the plating groove such that an upper surface of the plating layer and the first surface of the inner lead are flush.

2. The semiconductor lead frame of claim 1, wherein a thickness of the plating layer is within 70% of a thickness of the inner lead.

3. The semiconductor lead frame of claim 1, wherein a length of the plating groove is greater than a length of a portion of the inner lead where the insulating adhesion film is received.

4. A semiconductor packaging method comprising the steps of:

forming a plating groove in an inner lead at an end portion of a first surface of the inner lead;

setting a plating layer on the plating groove such that an upper surface of the plating layer and the first surface are flush;

attaching an insulating adhesive film to a second surface of the inner lead opposite the portion of the first surface in which the plating groove is formed; and pressing a semiconductor chip to adhere the semiconductor chip to the inner lead through the insulating adhesive film.

5. The semiconductor packaging method of claim 4, wherein the step of forming a plating groove comprises a pressing process.

6. The semiconductor packaging method of claim 4, wherein the step of setting a plating groove comprises a half etching process.

7. A semiconductor package, comprising:

an inner lead comprising first and second opposing surfaces;

an adhesive film attached to at least a portion of the second surface;

a plating groove formed to a predetermined depth at an end portion of the first surface of the inner lead opposite the portion of the second surface to which the insulating adhesive film is attached;

a plating layer set on the plating groove such that an upper surface of the plating layer and the first surface of the inner lead are flush; and a semiconductor chip attached to the insulating adhesive film.

* * * * *